United States Patent
Becker et al.

(10) Patent No.: US 9,599,902 B2
(45) Date of Patent: *Mar. 21, 2017

(54) PHOTOPOLYMERISABLE LAYERED COMPOSITE FOR PRODUCING FLEXO PRINTING ELEMENTS

(75) Inventors: Armin Becker, Großniedesheim (DE); Uwe Stebani, Flörsheim-Dalsheim (DE); Jens Schadebrodt, Mainz (DE); Uwe Krauss, Gossersweiler-Stein (DE)

(73) Assignee: Flint Group Germany GmbH, Stuttgart (DE)

(*) Notice: Subject to any disclaimer, the term of this patent is extended or adjusted under 35 U.S.C. 154(b) by 1856 days.

This patent is subject to a terminal disclaimer.

(21) Appl. No.: 12/305,817

(22) PCT Filed: Jun. 18, 2007

(86) PCT No.: PCT/EP2007/056019
§ 371 (c)(1),
(2), (4) Date: May 24, 2011

(87) PCT Pub. No.: WO2007/147803
PCT Pub. Date: Dec. 27, 2007

(65) Prior Publication Data
US 2011/0217658 A1    Sep. 8, 2011

(30) Foreign Application Priority Data

Jun. 22, 2006 (DE) .................. 10 2006 028 640

(51) Int. Cl.
| G03F 7/00 | (2006.01) |
| G03F 7/095 | (2006.01) |
| G03F 7/09 | (2006.01) |
| G03F 7/18 | (2006.01) |

(52) U.S. Cl.
CPC .............. *G03F 7/0955* (2013.01); *G03F 7/09* (2013.01); *G03F 7/18* (2013.01)

(58) Field of Classification Search
CPC ... G03F 7/033; G03F 7/36; G03F 7/11; G03F 1/003; G03F 7/115; G03F 7/325; B41N 1/12; B41N 6/00; B41M 5/24; B41M 5/52
USPC .................................................. 430/270.1
See application file for complete search history.

(56) References Cited

U.S. PATENT DOCUMENTS

| 3,264,103 | A | | 8/1966 | Cohen et al. | |
| 3,948,665 | A | | 4/1976 | Richter et al. | |
| 4,869,997 | A | * | 9/1989 | Koch et al. | 430/300 |
| 5,175,072 | A | | 12/1992 | Martens | |
| 5,176,986 | A | | 1/1993 | Telser et al. | |
| 5,576,818 | A | * | 11/1996 | Badesha et al. | 399/308 |
| 6,797,454 | B1 | * | 9/2004 | Hackler et al. | 430/306 |
| 7,972,666 | B2 | * | 7/2011 | Johnson et al. | 428/32.26 |
| 2006/0073417 | A1 | * | 4/2006 | Hermesdorf | 430/302 |
| 2006/0112844 | A1 | * | 6/2006 | Hiller et al. | 101/463.1 |
| 2006/0115602 | A1 | | 6/2006 | Beck et al. | |
| 2006/0249239 | A1 | * | 11/2006 | Krauss et al. | 156/59 |
| 2008/0257185 | A1 | * | 10/2008 | Becker et al. | 101/401.1 |

FOREIGN PATENT DOCUMENTS

| DE | 2722896 A1 | 11/1978 |
| DE | 2911980 A1 | 10/1980 |
| DE | 3704694 A1 | 8/1988 |
| EP | 0084851 B1 | 12/1986 |
| EP | 0251228 A2 | 1/1988 |
| EP | 0469375 A2 | 2/1992 |
| EP | 1069475 A1 | 1/2001 |
| EP | 1070989 A1 | 1/2001 |
| EP | 1072953 A1 | 1/2001 |
| EP | 1158365 A1 | 11/2001 |
| EP | 1193079 A2 * | 4/2002 |
| EP | 1731325 A1 | 12/2006 |
| FR | 2213513 | 8/1974 |
| GB | 1579817 | 11/1980 |
| JP | 3-192359 A | 8/1991 |
| JP | 2001-65582 A | 3/2001 |
| JP | 2003-83480 A | 3/2003 |
| JP | 2005219352 A | 8/2005 |
| WO | WO-90/11344 A1 | 10/1990 |
| WO | WO-94/03838 A1 | 2/1994 |
| WO | WO-96/14603 A1 | 5/1996 |
| WO | WO-01/39897 A2 | 6/2001 |
| WO | WO-01/88615 A1 | 11/2001 |
| WO | WO-2004/092841 A2 | 10/2004 |
| WO | WO 2004092841 A2 * | 10/2004 |
| WO | WO-2005095115 A1 | 10/2005 |

OTHER PUBLICATIONS http://www.mnrubber.com/Design_Guide/3-6.html (2014).*
http://redco1.com/rubber-information/polyisoprene-rubber (2014).*
"Flexographic printing technique," Coating Verlag, 1999, pp. 73-81, St. Gallen.

* cited by examiner

*Primary Examiner* — Chanceity Robinson
(74) *Attorney, Agent, or Firm* — Drinker Biddle & Reath LLP

(57) ABSTRACT

Laminate comprising
a) a photopolymerizable relief-forming layer, at least containing an elastomeric binder, ethylenically unsaturated monomers and a photoinitiator and optionally further additives,
b) an optionally photopolymerizable elastomeric substrate layer, at least containing an elastomeric binder, optionally ethylenically unsaturated monomers and a photoinitiator and optionally further additives,
the relief-forming layer a) having a hardness of 30 to 70° Shore A and the elastomeric substrate layer b) having a hardness of 75° Shore A to 70° Shore D in each case in the photopolymerized state, and the layer b) having a hardness of at least 5° Shore A greater than the layer a).

7 Claims, No Drawings

PHOTOPOLYMERISABLE LAYERED COMPOSITE FOR PRODUCING FLEXO PRINTING ELEMENTS

RELATED APPLICATIONS

This application is a national stage application (under 35 U.S.C. §371) of PCT/EP2007/056019, filed Jun. 18, 2007, which claims benefit of German Application No. 10 2006 028 640.5, filed Jun. 22, 2006.

The invention relates to a photopolymerizable laminate for the production of photopolymerizable cylindrical, continuous seamless flexographic printing elements, and a process for the production of the photopolymerizable cylindrical, continuous seamless flexographic printing elements by applying the laminate to a hollow cylinder.

Cylindrical flexographic printing plates are known in principle. In the case of a cylindrical flexographic printing plate, the impression cylinder of the printing press is provided with a printing layer or a print relief over the entire circumference. Cylindrical printing plates are very important for the printing of continuous patterns and are used, for example, for printing wallpapers, decorative papers or gift-wrapping papers. However, they are also used for printing non-continuous motifs in order to achieve as high a cost-efficiency as possible of the printing by means of a skilful arrangement of a plurality of copies.

In principle, the actual impression cylinder of the printing press can itself be provided with a completely enveloping printing layer. However, this procedure has the disadvantage that, when changing the printing plate, the entire impression cylinder now has to be replaced in certain circumstances. This is extremely complicated and accordingly expensive. Use of so-called sleeves is therefore usual. A sleeve is a cylindrical hollow body, also referred to as a core, which has been provided with a printing layer or a print relief. The sleeve technique permits very rapid and easy changing of the printing plate. The internal diameter of the sleeves corresponds to the external diameter of the impression cylinder so that the sleeves can simply be pushed over the impression cylinder of the printing press. Pushing the sleeves on and off functions according to the air cushion principle: for sleeve technology, the printing press is equipped with a special impression cylinder, a so-called air cylinder. The air cylinder has a compressed air collection at the end face, by means of which compressed air can be passed into the interior of the cylinder. From there, it can emerge again via holes arranged on the outside of the cylinder. For mounting a sleeve, compressed air is passed into the air cylinder and emerges again at the exit holes. The sleeve can now be pushed onto the air cylinder because it expands slightly under the influence of the air cushion, and the air cushion substantially reduces the friction. When the compressed-air feed is terminated, the expansion is eliminated and the sleeve fits firmly on the surface of the air cylinder. Further details on the sleeve technique are disclosed, for example, in "Technik des Flexodrucks" [Flexographic printing technique, page 73 at seq., Coating Verlag, St. Gallen, 1999.

However, high-quality round printing plates cannot be produced by simply completely surrounding the impression cylinder or a core with a flexographic printing plate processed so as to be ready for printing. In fact, a fine gap which, in genuine continuous motifs or offset copies, always intersects printing regions of the plate too remains at the abutting ends of the printing plate (the term offset copies is used if a plurality of motifs (copies) are arranged over the width of the printing plate and these are offset in the printing direction). This gap leads to a clearly visible line in the printed image. In order to avoid this line, only nonprinting wells will be present in this area, so that it is not possible to print any desired patterns. Moreover, there is in this technique the danger that the solvent present in the printing ink may penetrate into the gap and detach the ends of the printing plate from the impression cylinder. This leads to even greater disturbances in the printed image. Even when the ends are adhesively bonded, clearly visible traces still remain in the printed image.

For the production of high-quality round printing plates, it is therefore necessary to provide the impression cylinder or a core with a completely surrounding, relief-forming, photopolymerizable layer by means of suitable techniques. This can be effected, for example, by coating from solution or by ring extrusion. However, both techniques are extremely complicated and therefore correspondingly expensive. In particular, in these techniques, a separate, high-precision mould must as a rule be produced and used for each new external diameter. A widespread practice is therefore to wind a prefabricated, thermoplastically processable layer of photopolymerizable material around the impression cylinder or the core and to seal as well as possible the abutting edges of the photopolymerizable layer, also referred to as seam, by means of suitable techniques. Only in a second step is the cylindrical photopolymerizable flexographic printing element processed to give the finished round printing plate. Apparatuses for processing cylindrical flexographic printing elements are commercially available.

In the production of photopolymerizable flexographic printing elements with the use of prefabricated layers, it is particularly important to seal the seam completely and with extreme precision. The importance of this process step has further increased in recent years. Modern photopolymerizable flexographic printing elements, such as, for example digitally imageable flexographic printing elements, permit the production of flexgraphic printing plates having substantially higher resolution than was the case earlier. Flexographic printing is therefore increasingly also entering those areas which were formerly the preserve of other printing processes. At higher resolution, however, defects in the printing surface of the flexographic printing plate are also more quickly visible. For the same reason, high precision must likewise be ensured during application of the photopolymerizable, relief-forming layer. Thickness differences in the relief-forming layer have a considerable adverse effect on the concentricity of the impression cylinder and hence the print quality. In the case of high-quality flexographic printing plates, the thickness tolerance should usually be not more than ±10 µm.

Photopolymerizable, cylindrical flexographic printing elements can be produced, for example, by applying a layer of photopolymerizable material to a core so that the cut edges abut one another and then heating to about 160° C. until the material begins to melt and the cut edges run into one another.

DE-A 29 11 980 discloses a process in which a photosensitive resin film is wound around an impression cylinder. The seam is closed by bringing the impression cylinder into contact with a calender roll with rotation, and joining the cut edges to one another by melting.

When melting the photopolymerizable layer, however, it is scarcely possible to avoid the thickness of the photosensitive layer changing in an irregular manner. The impression cylinders or sleeves produced with the aid of such melting processes must therefore be subsequently ground and smoothed in order to obtain a good surface and ensure prints of high quality. This is pointed out by EP-A 469 375. Moreover, readily volatile constituents of the layer, such as, for example monomers, may evaporate during melting of the layer, with the result that the properties of the layer can change in a disadvantageous manner.

DE-A 27 22 896 has proposed adhesively bonding a commercially available, sheet-like, photopolymerizable flexographic printing element together with the substrate film to an impression cylinder or a core so that the cut edges abut one another. The cut edges are straight and are subsequently welded to one another under pressure and at elevated temperature. The welding can also be effected with the aid of a heated calender roll by causing the impression cylinder to rotate under pressure in contact with the calender roll until the ends join one another. The use of a plate having a substrate film is, however, extremely problematic. Typical substrate films have a thickness of from 0.1 to 0.25 mm. If the substrate film does not completely cover the circumference and, owing to a small mounting error or error when cutting to size, diverge even only minimally from one another, the space present between the film ends fills with polymeric material on calendering, and an impression of this gap remains on the surface of the photopolymerizable layer and leads to visible disturbances in the print. Such a flexographic printing element therefore also generally has to be subsequently ground and smoothed.

WO 2004/092841 therefore proposes an improved process for the production of cylindrical, continuous seamless, photopolymerizable flexographic printing elements which ensures better closure of the seam than in the known technologies and very good concentricity. The achievable seam closure is very good and finishing of the resulting flexographic printing element by complicated grinding and smoothing processes is superfluous. The process comprises the following steps:

(a) providing a laminate at least comprising a layer of a photopolymerizable material and a substrate film which can be peeled off from the layer,
(b) cutting the laminate edges to be joined to size by means of mitre cuts,
(c) pushing on and locking the hollow cylinder on a rotatably mounted support cylinder,
(d) applying an adhesion-promoting layer to the outer surface of the hollow cylinder,
(e) mounting the laminate cut to size with the side facing away from the temporary substrate film on the hollow cylinder provided with the adhesion-promoting layer, the ends provided with the mitre cut resting substantially one on top of the other but not overlapping,
(f) peeling off the substrate film from the layer of photopolymerizable material,
(g) joining the cut edges at a temperature below the melting point of the photopolymerizable layer by bringing the surface of the photopolymerizable layer on the hollow cylinder into contact with a rotating calender roll until the cut edges are joined to one another,
(h) removing the processed hollow cylinder from the support cylinder.

In the process of WO 2004/092841, a layer of a photopolymerizable material without a substrate film is therefore applied by means of an adhesion-promoting layer to the outer surface of a hollow cylinder, the layer ends of which are then joined without a gap by calendering. Dispensing with a substrate film is necessary for several reasons:

(1) If a photopolymeric layer having a substrate film (as a rule a PET film which shows no measurable melt flow index at the temperatures used for calendering) is used, very small mounting errors or errors when cutting to size lead to a gap (divergence) or to overlapping of the ends of the substrate film. If divergence occurs, the space then present between the two film ends may fill with polymeric material during calendering, but an impression of this gap which leads to visible disturbances in the print remains on the surface of the photopolymerizable layer. If the two film ends overlap, this leads to a perceptible butt joint visible in the print on the surface of the printing plate. If, on the other hand, a layer of a photopolymerizable material without a substrate film is used, mounting errors and errors when cutting to size are compensated by the flowability of the material at the processing temperature. Neither a gap nor a butt joint forms. The printing behaviour at this point does not differ from that in the other regions of the printing plate.
(2) If a layer of a photopolymerizable material having a substrate film is mounted on a hollow cylinder having a small diameter, the rigid substrate film results in rising at the plate ends, so-called gaping. On the other hand, a layer of a photopolymerizable material without a substrate film is substantially more flexible so that even the smallest sleeve diameter can be covered without problems.
(3) A substrate film changes both the deformation and elastic behaviour and the printing behaviour of the printing plate. As a rule, a rigid film under the photopolymeric layer leads to a greater increase in tonal value and to poorer area coverage.

In addition to said advantages, however, dispensing with a stabilizing substrate film also proves to be disadvantageous.

(1) The adhesion-promoting layer described in WO 2004/092841 is a double-sided adhesive tape which is applied to the wood cylinder before the plate is mounted. It may be a single film adhesive tape having a thickness of, for example, 0.1 mm or a foam adhesive tape. The latter have typical thicknesses of 0.38 or 0.55 mm. With the use of an adhesion-promoting tape as an adhesive layer, however, even minimum mounting errors or errors when cutting to size lead here too to a space between the two edges of the adhesive tape. This fills with photopolymeric material on calendering, and an impression of this gap remains on the surface of the photopolymerizable layer and leads to visible disturbances in the print. If a foam adhesive tape is used, there may be an additional problem since the cells of the foam are cut (destroyed) along the cut edge during cutting to size. Depending on the type of foam used, this may lead to sinking of the foam in this area so that different deformation and elastic behaviour and hence also different printing behaviour results in comparison with the remaining printing plate. If, on the other hand, a photopolymeric layer present on a substrate film is mounted, these problems are eliminated by the rigid polyester substrate film between photopolymeric layer and adhesive tape.
(2) The insufficient adhesion between photopolymeric layer and adhesion-promoting layer also proves to be disadvantageous. Insufficient adhesion may result in inclusion of air bubbles between adhesion-promoting layer and photopolymeric layer, and the seamless continuous printing plate to be produced thus becomes unusable. Although the low adhesion can be compensated by a higher contact pressure during mounting of the plate, a higher contact pressure leads to undesired lengthening of the plate. Further adhesion between the adhesion-promoting layer and photopolymeric layer would thus be desirable.

(3) A further disadvantage of this printing plate described in WO 2004/092841 is evident in the print and in fact, owing to the lack of a rigid substrate film, starting edges occur in the print.

It is an object of the present invention to provide, for the process described in WO 2004/092841, a material which does not have the disadvantages described.

Surprisingly, this could be achieved by the use of a laminate comprising at least one relief-forming layer of a photopolymerizable material and an underlying harder, meltable substrate layer. This is particularly surprising for the person skilled in the art since it is usually advantageous in printing if the surface of a printing plate is harder than the layer present underneath.

The object is therefore achieved by a laminate comprising
a) a photopolymerizable relief-forming layer, at least containing an elastomeric binder, ethylenically unsaturated monomers and a photoinitiator and optionally further additives,
b) an optionally photopolymerizable elastomeric substrate layer, at least containing an elastomeric binder, optionally ethylenically unsaturated monomers and a photoinitiator and optionally further additives,
the relief-forming layer a) having a hardness of 30 to 70° Shore A (according to DIN) and the elastomeric substrate layer b) having a hardness of 75° Shore A to 70° Shore D (according to DIN) in each case in the photopolymerized state, and the layer b) having a hardness of at least 5° Shore A greater than the layer a).

The laminate according to the invention may have further layers. For example, the laminate may have the following composition, in the sequence (1)-(6):
(1) substrate film
(2) release layer
(3) substrate layer b)
(4) relief-forming layer a)
(5) release layer
(6) cover sheet.

The laminate according to the invention may comprise a substrate film. This is preferably of polyethylene terephthalate (PET) or polyethylene naphthalate (PEN). For better peelability, this can be treated in a suitable manner, for example by siliconization or by coating with a suitable release layer. Such release layers may consist, for example, of polyamides or polyvinyl alcohols.

The elastomeric substrate layer b) is present on the substrate film optionally coated with the release layer. Said elastomeric substrate layer has a hardness which is greater than the hardness of the relief-forming layer a). Under processing conditions, the substrate layer b) has meltability and flowability and has sufficiently high adhesion to the adhesion-promoting layer applied to the hollow cylinder or to the adhesive tape, even after exposure to light or preexposure of the back to light. The substrate layer can optionally be photochemically crosslinkable.

The elastomeric substrate layer b) also replaces the absent substrate film with regard to the mechanical properties thereof. Thus, in spite of the absence of a rigid substrate film, there is no greater formation of starting edges in the print. It is however—in contrast to a substrate film—meltable and flowable under the processing conditions. The substrate layer also has greater adhesion to the adhesion-promoting layer applied to the hollow cylinder than the photopolymerizable relief-forming layer. The tape gap is bridged owing to the hardness and stiffness of the substrate layer.

The photopolymerizable relief-forming layer a) is present on the elastomeric substrate layer b).

Both the photopolymerizable relief-forming layer a) and the elastomeric substrate layer b) contain at least one elastomeric binder.

Elastomeric binders for the production of flexographic printing elements are known to the person skilled in the art. Both hydrophilic and hydrophobic binders may be used. Ethylene-acrylic acid copolymers, polyethylene oxide-polyvinyl alcohol graft copolymers, natural rubber, polybutadiene, polyisoprene, styrene-butadiene rubber, nitrile-butadiene rubber, butyl rubber, styrene-isoprene rubber, styrene-butadiene-isoprene rubber, polynorbornene rubber or ethylene-propylene-diene rubber (EPDM) may be mentioned as examples. Hydrophobic binders are preferably used. Such binders are soluble or at least swellable in organic solvents whereas they are substantially insoluble in water and are also not swellable or at least not substantially swellable in water.

The elastomer is preferably a thermoplastic elastomeric block copolymer of alkenyl aromatics and 1,3-dienes. The block copolymers may be linear, branched or radial block copolymers. Usually, they are three-block copolymers of the A-B-A type, but they may also be two-block polymers of the A-B type, or those having a plurality of alternating elastomeric and thermoplastic blocks, e.g. A-B-A-B-A. Blends of two or more different block copolymers may also be used. Commercially available three-block copolymers frequently contain certain proportions of two-block copolymers. The diene units may be 1,2- or 1,4-linked. Both block copolymers of the styrene-butadiene or of the styrene-isoprene type and of the styrene-butadiene-isoprene type may be used. They are commercially available, for example, under the name Kraton®. Furthermore, thermoplastic elastomeric block copolymers having end blocks of styrene and a statistical styrene-butadiene middle block, which are available under the name Styroflex®, may also be used. The block copolymers may also be completely or partly hydrogenated, as, for example, in SEBS rubbers.

Elastomeric binders very particularly preferably present in the photopolymerizable relief-forming layer a) are three-block copolymers of the A-B-A type or radial block copolymers of the $(AB)_n$ type, in which A is styrene and B is a diene.

Elastomeric binders very particularly preferably present in the elastomeric substrate layer b) are three-block copolymers of the A-B-A type, radial block copolymers of the $(AB)_n$ type, in which A is styrene and B is a diene, and statistical copolymers and random copolymers of styrene and a diene.

It is of course also possible to use mixtures of a plurality of binders provided that the properties of the relief-forming layer are not adversely affected thereby.

In the case of the relief-forming layer a), the total amount of binders is usually 40 to 90% by weight, based on the sum of all constituents of the relief-forming layer, preferably 40 to 80% by weight and particularly preferably 45 to 75% by weight. In the case of the elastomeric substrate layer b), the total amount of elastomeric binders may be up to 100% by weight. Usually, it is 75 to 100% by weight, preferably 85 to 100% by weight and particularly preferably 90 to 100% by weight.

The photopolymerizable relief-forming layer a) furthermore comprises in a known manner ethylenically unsaturated monomers. The monomers are compatible with the binders and have at least one polymerizable, ethylenically unsaturated double bond. Esters or amides of acrylic acid or methacrylic acid with mono- or polyfunctional alcohols, amines, amino alcohols or hydroxy ethers and hydroxy esters, esters of fumaric or maleic acid or allyl compounds have proved to be particularly advantageous. Examples of suitable monomers are butyl acrylate, 2-ethylhexyl acrylate, lauryl acrylate, 1,4-butanediol diacrylate, 1,6-hexanediol diacrylate, 1,6-hexanediol dimethacrylate, 1,9-nonanediol diacrylate, trimethylolpropane tri(meth)acrylate, dioctyl fumarate and N-dodecylmaleimide. Very particularly preferred monomers are mono-, di- or triacrylates and mono-, di- and trimethacrylates. It is of course also possible to use mixtures of a plurality of different monomers. The type and amount of the monomers are chosen by the person skilled in the art according to the desired properties of the layer. In the photopolymerizable relief-forming layer a), the amount of monomers is as a rule not more than 20% by weight, based on the amount of all constituents, in general between 3 and 15% by weight.

The photopolymerizable relief-forming layer furthermore comprises at least one photoinitiator or a photoinitiator system in a manner known in principle. Examples of suitable initiators are benzoin or benzoin derivatives, such as methylbenzoin or benzoin ethers, benzyl derivatives, such as benzyl ketals, acylarylphosphine oxides, acylarylphosphine acid esters, polynuclear quinones or benzophenones. The amount of photoinitiator in the relief-forming layer is as a rule 0.1 to 5% by weight, based on the amount of all constituents of the relief-forming layer.

The elastomeric substrate layer b) may likewise contain said ethylenically unsaturated monomers and said photoinitiators and preferably contains them, i.e. is photopolymerizable like the relief-forming layer. In general, the amount of ethylenically unsaturated monomers in the substrate layer is 0 to 15% by weight. In general, the amount of photoinitiator in the substrate layer is 0 to 5% by weight.

The relief-forming layer a) and/or the elastomeric substrate layer b) may optionally contain plasticizer. Mixtures of different plasticizers may also be used. Examples of suitable plasticizers include modified and unmodified natural oils and natural resins, such as high-boiling paraffinic, naphthenic or aromatic mineral oils, synthetic oligomers or resins, such as oligostyrene, high-boiling esters, oligomeric styrene-butadiene copolymers, oligomeric α-methylstyrene/p-methylstyrene copolymers, liquid oligobutadienes, in particular those having a molecular weight between 500 and 5000 g/mol, or liquid oligomeric acrylonitrile-butadiene copolymers or oligomeric ethylene-propylene-diene copolymers. Polybutadiene oils (liquid oligobutadienes), in particular those having a molecular weight between 500 and 5000 g/mol, high-boiling aliphatic esters, such as in particular alkyl mono- and dicarboxylates, for example stearates or adipates, and mineral oils are preferred. High-boiling, substantially paraffinic and/or naphthenic mineral oils are particularly preferred. For example, so-called paraffin-based solvates and special oils are commercially available under the names Shell Catenex® S and Shell Catenex® PH. The person skilled in the art distinguishes in the case of mineral oils between technical white oils, which may still have a very low aromatics content, and medical white oils, which are substantially free of aromatics. They are commercially available and equally suitable. The amount of an optionally present plasticizer is determined by a person skilled in the art according to the desired properties of the layer. It will as a rule not exceed 50% by weight of the sum of all constituents of the photopolymerizable relief-forming layer, and is in general 0 to 50% by weight, preferably 0 to 40% by weight.

The plasticizer content in the substrate layer will as a rule not exceed 30% by weight and is in general 0 to 20% by weight, preferably 0 to 10% by weight.

The hardness of the layers a) and b) can be established in various ways. In particular, it can be established by
1. the type and amount of elastomeric binders;
2. the type and amount of the plasticizers used;
3. the type and amount of the ethylenically unsaturated monomers.

The hardness of the layers a) and b) can be chosen within the above-defined ranges by the choice of the exact composition. In general, the elastomeric substrate layer b) is at least 5° Shore A, preferably at least 10° Shore A, harder than the relief-forming layer a).

The following may be present in the elastomeric substrate layer b) as further additives: adhesion promoters, dyes, pigments, fillers, rheology additives, IR absorbers and IR-reflecting substances.

The thickness of the relief-forming layer a) is in general 0.3 to 7 mm, particularly 0.5 to 4 mm. The thickness of the elastomeric substrate layer b) is in general 0.05 to 025 mm, preferably 0.075 to 0.2 mm.

A cover sheet coated with an (optional) release layer may be present on the photopolymerizable relief-forming layer a), analogously to the substrate film described above. The cover sheet is preferably of PET or PEN and, for better peelability, may have been treated in a suitable manner, for example by siliconization. It is also possible to provide a release layer of polyamides or polyvinyl alcohols.

The laminate can be produced in a known manner by various processes, for example by extrusion, casting or lamination, in a one-stage or multistage production process. An example of a one-stage production process would be the coextrusion of the photopolymeric layer and of the substrate layer between the substrate films or cover sheets optionally also containing a release layer. A multistage process may comprise, for example, two extrusion steps for extruding the substrate layer and the photopolymeric layer, two casting steps for casting the substrate layer and the photopolymeric layer, or a combination of an extrusion step (substrate layer or photopolymeric layer) and a casting step (substrate layer or photopolymeric layer). The thickness of the laminate is as a rule 0.3 to 7 mm, preferably 0.5 to 4 mm and particularly preferably 0.7 to 2.5 mm.

The further processing of the laminate produced to give a seamless continuous printing plate is described in detail in WO 2004/092841, and the procedure is substantially as follows:

Production of the Seamless Continuous Printing Plate:

The substrate layer b) can optionally be preexposed from the back to actinic light before being mounted on the hollow cylinder. The preexposure should as a rule be effected before the laminate is cut to size, in order to ensure problem-free joining of the cut edges. The edges of the provided laminate which are to be joined are then cut to size, this usually being carried out by means of mitre cuts. If a UV-transparent core is used, the preexposure can of course also be effected from the inside of the core after mounting of the laminate on the core.

The hollow cylinders used are customary hollow cylinders which are suitable for mounting on air cylinders, i.e. can expand slightly under the influence of compressed air. Such hollow cylinders are also referred to as cores or sometimes also as sleeves, base sleeves or the like. For the purposes of this invention, the hollow cylinders used as supports are to be referred to below as core while the term "sleeve" is to be reserved for the flexographic printing element as a whole, i.e. including the photopolymerizable layer, adhesive layer and possibly further layers.

For carrying out the process according to the invention, the hollow cylinders used are then pushed onto a rotatably mounted support cylinder and locked so that the hollow cylinder is firmly connected to the support cylinder and no movement relative to one another is possible. The support cylinder provides firm retention for the subsequent calendering process.

The adhesion-promoting layer is then applied to the outer surface of the hollow cylinder. The adhesion-promoting layer should impart good adhesion even at elevated temperatures as prevail during the calendering process. It should in particular impart very good shear strength so that the laminate does not slip on the surface of the hollow cylinder during the calendering process. The adhesion-promoting layer may be a suitable mixture of adhesive-forming components which is applied to the surface of the hollow cylinder. However, the adhesion-promoting layer is preferably a double-sided adhesive film. In particular, the adhesive films may be foam adhesive films which additionally have a damping foam layer.

This is followed by the mounting of the photopolymerizable laminate on the hollow cylinder provided with the adhesion-promoting layer. After mounting of the laminate, any cover sheet present, including a possibly present release layer, is peeled off from the relief-forming layer a).

The cut edges are then joined. For joining the cut edges, the surface of the laminate on the hollow cylinder is brought into contact with a rotating calender roll until the cut edges are joined to one another. The support cylinder and the calender roll rotate in opposite directions. The required calender pressure is determined by the person skilled in the art according to the type of photopolymerizable layer by adjusting the distance between the support cylinder and the calender roll. The calendering temperature depends on the type of photopolymerizable layer and the desired properties. However, the temperature of the calendering roll is set according to the invention so that the temperature of the photopolymerizable layer is below its melting point in every case. Expediently, heat is supplied by using a calender roll heated from the inside, an IR lamp or warm gas streams. Of course, heat sources may also be combined. As a rule, the temperature during calendering is 80 to 130° C., preferably 90 to 120° C., measured in each case at the surface of the photopolymerizable layer. As a rule, about 15 min are required for complete gap closure, this time of course also being dependent on the chosen temperature and the pressure.

After closure of the seam and optionally cooling, the processed hollow cylinder/finished sleeve is removed again from the support cylinder.

The invention therefore also relates to a process for the production of photopolymerizable cylindrical, continuous seamless flexographic printing elements, in which the starting material used is a laminate comprising at least
a) a photopolymerizable relief-forming layer, at least containing an elastomeric binder, ethylenically unsaturated monomers and a photoinitiator and optionally further additives,
b) an optionally photopolymerizable elastomeric substrate layer, at least containing an elastomeric binder, optionally ethylenically unsaturated monomers and a photoinitiator and optionally further additives,
the relief-forming layer a) having a hardness of 30 to 70° Shore A (according to DIN) and the elastomeric substrate layer b) having a hardness of 75° Shore A to 70° Shore D (according to DIN) in each case in the photopolymerized state, and the substrate layer b) having a hardness at least 5° Shore A greater than the relief-forming layer a),
and the process comprising the following steps:
(i) cutting the laminate edges to be joined to size by means of mitre cuts,
(ii) pushing on and locking a hollow cylinder on a rotatably mounted support cylinder,
(iii) applying an adhesion-promoting layer to the outer surface of the hollow cylinder,
(iv) mounting the laminate cut to size, optionally after peeling off a substrate film, with the elastomeric substrate layer b), on the hollow cylinder provided with the adhesion-promoting layer, the ends provided with the mitre cut resting substantially one on top of the other but not overlapping,
(v) optionally peeling off a cover sheet from the photopolymerizable relief-forming layer a),
(vi) joining the cut edges by bringing the surface of the photopolymerizable layer on the hollow cylinder into contact with a rotating calender roll with heating until the cut edges are joined to one another,
(vii) removing the processed hollow cylinder from the support cylinder.

The further processing to give flexographic printing plates can be effected by various techniques. The flexographic printing elements can be exposed imagewise, for example, in a manner known in principle, and the unexposed parts of the relief-forming layer a) are then removed by means of a suitable development process. The imagewise exposure can be effected in principle by surrounding the sleeve with a photographic mask and effecting exposure through the mask.

Preferably, however, the imaging is carried out by means of digital masks. Such masks are also known as in-situ masks. For this purpose, a digitally imageable layer is first applied to the photopolymerizable relief-forming layer a) of the sleeve.

The digitally imageable layer is preferably a layer selected from the group consisting of IR-ablative layers, inkjet layers or thermographically inscribable layers.

IR-ablative layers or masks are opaque to the wavelength of actinic light and usually comprise a binder and at least one IR absorber, such as, for example, carbon black. Carbon black also ensures that the layer is opaque. A mask can be written into the IR-ablative layer by means of an IR laser, i.e. the layer is decomposed and removed from the areas where the layer has been impinged by the laser beam. Examples of the imaging of flexographic printing elements using IR-ablative masks are disclosed, for example, in EP-A 654 150 or EP-A 1 069 475.

In the case of inkjet layers, a layer inscribable using inkjet inks and transparent to actinic light, for example a gelatine layer, is applied. A mask is applied to this by means of inkjet printers using opaque ink. Examples are disclosed in EP-A 1 072 953.

Thermographic layers are layers which contain substances which become black under the influence of heat. Such layers comprise, for example, a binder and an organic silver salt and can be imaged by means of a printer having a thermal printing head. Examples are disclosed in EP-A 1 070 989.

The digitally imageable layers can be produced by dissolving or dispersing all constituents of the respective layer in a suitable solvent and applying the solution to the photopolymerizable layer of the cylindrical flexographic printing element, followed by evaporation of the solvent. The application of the digitally imageable layer can be effected, for example, by spraying on or by means of the technique described in EP-A 1 158 365.

After application of the digitally imageable layer, the latter is imaged by means of the respective suitable technique and the sleeve is then irradiated through the resulting mask in a manner known in principle by means of actinic light. Suitable actinic, i.e. chemically "active", light is known to be in particular UVA or UV/VIS radiation. Cylindrical exposure units for uniform exposure of sleeves are commercially available.

The development of the imagewise exposed relief-forming layer a) can be effected in a conventional manner by means of a solvent or of a solvent mixture. The unexposed parts of the relief layer, i.e. those covered by the mask, are removed by dissolution in the developer while the exposed, i.e. the crosslinked, parts remain. The mask or the remainder of the mask is likewise removed by the developer, if the components therein are soluble. If the mask is not soluble in the developer, it is optionally removed before the development with the aid of a second solvent.

The development can also be effected thermally. In the thermal development, no solvent is used. Instead, after the imagewise exposure, the relief-forming layer is brought into contact with an absorbent material and heated. The absorbent material may be, for example, a porous nonwoven, for example of nylon, polyester, cellulose or inorganic materials. Heating is effected to a temperature such that the unpolymerized parts of the relief-forming layer become liquid and can be absorbed by the nonwoven. The saturated nonwoven is then removed. Details of the thermal development are disclosed, for example, in U.S. Pat. No. 3,264,103, U.S. Pat. No. 5,175,072, WO 96/14603 or WO 01/88615. The mask can optionally be removed beforehand by means of a suitable solvent or likewise thermally.

The production of cylindrical flexographic printing plates from the photopolymerizable, continuous seamless flexographic printing elements can also be carried out by means of direct laser engraving. In this process, the photopolymerizable layer is first crosslinked completely in the total volume by means of actinic light, electron beams or γ-radiation, without placing the mask on top. A print relief is then engraved into the crosslinked layer by means of one or more lasers.

The uniform crosslinking can be effected using customary cylindrical exposure units for sleeves, as described above. Particularly advantageously, however, it can also be effected on the basis of the process described in WO 01/39897. Here, exposure is effected in the presence of an inert gas which is heavier than air, for example $CO_2$ or Ar.

For this purpose, the photopolymerizable, cylindrical flexographic printing element is lowered into an immersion tank which is filled with an inert gas and the walls of which are preferably lined with a reflective material, for example aluminium foil. The filling of the immersion tank with inert gas can be effected, for example, by introducing into the immersion tank dry ice which displaces the atmospheric oxygen on vaporization, or else a gas having a higher density than air, for example carbon dioxide or argon, is passed into the immersion tank to displace the oxygen. Exposure is then effected from above by means of actinic light. In principle, the customary UV or UV/VIS sources for actinic light can be used for this purpose. Radiation sources which substantially emit visible light and no UV light or only small proportions thereof are preferably used. Light sources which emit light having a wavelength of more than 300 nm are preferred. For example, customary halogen lamps may be used. The process has the advantage that the ozone pollution customary in the case of short-wave UV lamps is largely completely absent, protective measures against strong UV radiation are as a rule unnecessary and no complicated apparatuses are required. Thus, this process step can be carried out in a particularly economical manner.

In direct laser engraving, the relief layer absorbs laser radiation to such an extent that it is removed or at least detached in those areas where it is exposed to a laser beam of sufficient intensity. Preferably, the layer is vaporized or thermally or oxidatively decomposed without melting beforehand, so that the decomposition products are removed from the layer in the form of hot gases, vapours, fumes or small particles.

Lasers which have a wavelength of 9000 nm to 12 000 nm are particularly suitable for engraving the relief-forming layers used according to the invention. In particular, $CO_2$ lasers may be mentioned here. The binders used in the relief-forming layer absorb the radiation of such lasers to a sufficient extent to be able to effect engraving.

Advantageously, the cylindrical flexographic printing plate obtained can be cleaned after the laser engraving in a further process step. In some cases, this can be effected by simple blowing off with compressed air or brushing off. However, it is preferable to use a liquid cleaning agent for the cleaning, in order to be able to remove even polymer fragments completely. For example, aqueous cleaning agents which substantially comprise water and optionally small amounts of alcohols and which may contain auxiliaries, such as, for example surfactants, emulsifiers, dispersants or bases, for supporting the cleaning process, are suitable. "Water-in-oil" emulsions, as described in EP-A 463 016, are also suitable.

The invention is explained in more detail by the following examples.

EXAMPLES

General Method for the Production of the Substrate Layers Used

The substrate layers used were produced by means of casting from solution in toluene onto a PET film as a substrate film, which was coated with a 5 µm thick layer as the polyamide Makromelt 6900 as the release layer.

General Method for the Production of the Laminates Used

The laminates used according to the invention are produced by extruding the photopolymerizable material, discharging it through a slot die and calendering it between the substrate layer and the cover sheet. The extrusion process is described in detail in EP-B 084 851. The substrate layers described below under A) are used as the substrate layer, and the cover sheet used is a PET film coated with 5 µm Makromelt 6900. The laminate comprising substrate layer and photopolymeric layer has a total thickness of 1.14 mm.

General Method for the Production of a Seamless/Continuous Printing Plate

For carrying out this process step, the core to be occupied by the laminate is first pushed onto the air cylinder of the mounting apparatus. The adhesive film is then cut to size on the mounting table, the air cylinder is caused to rotate and the film is slowly pushed into the gap between auxiliary roll and the air cylinder provided with the core. The adhesive film is carried along by the rotation, the auxiliary roll uniformly pressing the film onto the core so that the adhesive film adheres firmly to the core without bubbles. The protective film is then peeled off from the adhesive film. The core is now provided with an adhesion-promoting layer. In the next step, after removal of the substrate film (optionally including release layer), the photopolymerizable laminate cut to size is pushed into the gap, carried along and pressed firmly by the auxiliary roll. The substrata layer is directed towards the core. The calender roll and the air cylinder provided with core, adhesion-promoting layer, substrate layer and photopolymerizable layer are brought into contact with one another and caused to rotate, and the gap is closed by calendering with introduction of heat.

General Method for the Further Processing of the Seamless/Continuous Printing Plate By means of a ring coater, the seamless/continuous printing plates are provided with a digitally imageable layer. The coating is effected by means of a ring coater, and the coating solution used is a DSL II 80 solution (Flint Group Germany GmbH). After the application of the digitally imageable layer, the latter is imaged by means of the respective suitable technique and the sleeve is then exposed by means of actinic light through the resulting mask in a manner known in principle. Suitable actinic, i.e. chemically "active", light is known to be in particular UVA or UV/VIS radiation. Cylindrical exposure units for the uniform exposure of sleeves are commercially available.

The development of the imagewise exposed layer is effected in a conventional manner using the washout agent Nylosolv® A (Flint Group Germany GmbH).

Starting materials used:
Styroflex® 2G66: SBS block copolymer (BASF AG)
Styrolux® 3G55: SBS block copolymer (BASF AG)
Kraton® D-1102: SBS block copolymer (Kraton Polymers)
Kraton® D-4150: SBS block copolymer with 33% of mineral oil (Kraton Polymers)
Polyöl® 130: Oligobutadiene, plasticizer (Degussa)
Laromer® HDDA: 1,6-Hexanediol diacrylate (BASF)
HDDMA: 1,6-Hexanediol dimethacrylate (Rohm GmbH & Co. KG)
Lucirin® BDK: Benzil dimethyl ketal (BASF)
Kerobit® TBK: 2,6-Di-tert-butyl p-cresol (Raschig)

A) Production of the Substrate Layers

Example 1

Production of the Substrate Layer 1 (SL-1)

The substrate layer 1 (SL-1) was produced as described in the general method, using the composition stated in Table 1. The thickness of the dry substrate layer was 75 µm.

TABLE 1

Composition of the substrate layer 1

| Component | Amount |
| --- | --- |
| SBS block copolymer (Styroflex 2G66) | 94% |
| Hexanediol dimethacrylate monomer | 5% |
| Benzil dimethyl ketal (photoinitiator) | 1% |
| Total | 100% |

Example 2

Production of the Substrate Layer 2 (SL-2)

The substrate layer 2 (SL-2) was produced as described in the general method. The composition of the substrate layer corresponded to that of the substrate layer 1 but the thickness of the dry substrate layer was 125 µm.

Example 3

Production of the Substrate Layer 3 (SL-3)

The substrate layer 3 (SL-3) was produced as described in the general method, using the composition stated in Table 2. The thickness of the dry substrate layer was 125 µm.

TABLE 2

Composition of the substrate layer 3

| Component | Amount |
| --- | --- |
| SBS block copolymer (Styrolux 3G55) | 94% |
| Hexanediol dimethacrylate monomer | 5% |
| Photoinitiator | 1% |
| Total | 100% |

Comparative Example 1

Substrate Layer 4 (SL-4)

A commercially available PET film having a thickness of 175 µm was used as substrate layer 4.

Comparative Example 2

Substrate Layer 5 (SL-5)

The substrate layer 5 was produced as described in the general method, using the composition stated in Table 3. The thickness of the dry substrate layer was 125 µm.

TABLE 3

Composition of the substrate layer 3

| Component | Amount |
| --- | --- |
| Kraton ® D-4150 | 74% |
| Polyöl 130 plasticizer | 20% |
| Hexanediol dimethacrylate monomer | 5% |
| Photoinitiator | 1% |
| Total | 100% |

Example 6

Determination of Melt Flow Indices and Hardness of the Substrate Layers Produced For determining the melt flow indices and hardness of the substrate layers produced, the substrate layers 1, 2, 3 and 5 were peeled off from their substrate film. The substrate layer 4 was used in the form acquired. The melt flow index (MVR) was determined at a temperature of 80° C. and in an applied weight of 5 kg according to DIN ISO 1133.

The measurement of the Shore A hardness was effected according to DIN 53 505. For this purpose, layers corresponding to the examples were produced in a thickness of 1 mm and crosslinked by uniform exposure for 15 minutes to UVA light (exposure unit F III, Flint Group Germany GmbH). In each case 6 1 mm thick layers of each layer type were stacked one on top of the other in order to achieve a total layer thickness of 6 mm. The hardness of the 6 mm thick layer stacks was determined using a hardness-measure apparatus (type U72/80E, Heinrich Bareiss Prüfgerätebau GmbH) according to DIN 53 505.

The results are summarized in Table 4. For comparison, melt flow index and hardness of the photopolymeric layer are likewise stated.

TABLE 4

Melt flow indices of the substrate layers produced.

|  | SL-1 | SL-2 | SL-3 | SL-4 | SL-5 | FL |
|---|---|---|---|---|---|---|
| Melt flow index |  |  |  |  |  |  |
| MVR (5 kg/200° C.), cm³/10 min. | 34 | 46 | 46 | 0 | >150 | >150 |
| Hardness |  |  |  |  |  |  |
| Hardness, ° Shore A | 94 | 99 | 99 |  | 32 | 62 |
| Tensile test: |  |  |  |  |  |  |
| Stress in unexposed state, | 17.3 | 18.3 | 14.4 | 125 | 0.3 | 0.2 |
| Stress in exposed state, N/mm² | 18.1 | 22.7 | 21.5 | 125 | 1.8 | 5.8 |
| Elongation in unexposed state, N/mm² | 547 | 410 | 500 | 69 | 1070 | 290 |
| Elongation in exposed state, N/mm² | 281 | 290 | 260 | 69 | 430 | 403 |
| Modulus of elasticity (@ 125%) in unexposed state, % | 5.3 | 10.2 | 8.7 | n.d. | 0.1 | 0.1 |
| Modulus of elasticity (@ 125%) in exposed state, % | 10.1 | 16.9 | 17.4 | n.d. | 0.5 | 2.2 |

SL = substrate layer
PL = photopolymeric layer

B) Production of the Laminates

Examples 7a-7f

The laminates were produced as described in the general method. The photopolymeric layer was based on the formulation stated in Table 5.

TABLE 5

Composition of the photopolymeric layer

| Component | Amount |
|---|---|
| SBS block copolymer (Kraton D 1102) | 55% |
| Plasticizer (polybutadiene oil) | 32% |
| Monomer (hexanediol diacrylate) | 10% |
| Benzil dimethyl ketal (photoinitiator) | 2% |
| Additives (heat stabilizer, dye) | 1% |
| Total | 100% |

The photopolymeric layer was calendered between the substrate layers produced according to A) and in each case a cover sheet. In each case a PET film coated with 5 μm Makromelt 6900 was used as cover sheets. The laminate comprising substrate layer and photopolymeric layer had a total thickness of 1.14 mm without cover sheet and without substrate film. Table 6 gives an overview of the finished laminates.

TABLE 6

Finished laminates

|  | Substrate layer | Photopolymeric layer |
|---|---|---|
| Example 7a | None | PL-1 (1140 μm) |
| Example 7b | SL 1 | PL-1 (1065 μm) |
| Example 7c | SL 2 (125 μm Styroflex) | PL-1 (1015 μm) |
| Example 7d | SL 3 (125 μm Styrolux) | PL-1 (1015 μm) |
| Example 7e | SL 4 (PET film) | PL-1 (965 μm) |
| Example 7f | SL 5 (125 μm Kraton D-4150) | PL-1 (1015 μm) |

Comparative examples are Examples 7a (no substrate layer), 7e (PET film as substrate layer) and 7f (soft photopolymeric layer). The adhesion of the laminates produced on the foam adhesive tape (Rogers SA2520) are compared in Table 7.

TABLE 7

Properties of the laminates

|  | Ex. 7a Comparison | Ex. 7b | Ex. 7c | Ex. 7d | Ex. 7e Comparison | Ex. 7f Comparison |
|---|---|---|---|---|---|---|
| Adhesion to foam adhesive tape [N] | 0.1 | >5 | >5 | >5 | >5 | 0.3 |

The results in Table 7 show that the mechanical properties of the laminates produced are substantially improved by the substrate layer. The substantially improved adhesion to foam adhesive tape should additionally be singled out.

Production of the Seamless/Continuous Printing Plates:

Seamless/continuous printing plates were produced from the laminates produced in Examples 7a-7f, as described in the general method. The support used was an Onyx core from Polywest, and a double-sided foam adhesive tape (Rogers SA 2520) was used for fixing the laminate to the core. These were provided with a digitally imageable layer, imaged, exposed to light, washed out, dried and aftertreated.

Printing Experiments

Proof printing with the printing plate was effected on a W&H printing press, a PE film was used as print substrate and the printing speed was 150 m/min. Table 8 shows the quality of the printing plates with regard to the appearance of tape and plate gap and occurrence of starting edges in the printed image.

TABLE 8

Quality of the printing plates

| Laminates from | Tape gap | Plate gap | Starting edge |
|---|---|---|---|
| Example 7a (comparison) | visible | not visible | visible |
| Example 7b | not visible | not visible | not visible |
| Example 7c | not visible | not visible | not visible |
| Example 7d | not visible | not visible | not visible |
| Example 7e (comparison) | not visible | visible | not visible |
| Example 7f (comparison) | not visible | not visible | not visible |

The invention claimed is:

1. A laminate comprising
a) a photopolymerizable relief-forming layer comprising an elastomeric binder, ethylenically unsaturated monomers, a photoinitiator, and optionally further additives;
b) an elastomeric substrate layer which is optionally photopolymerizable comprising an elastomeric binder, optionally ethylenically unsaturated monomers, a photoinitiator, and optionally further additives;
wherein said photopolymerizable relief-forming layer a) has a hardness of 30 to 70° Shore A and said elastomeric substrate layer b) has a hardness of from 75° Shore A to 70° Shore D in the photopolymerized state, and wherein said elastomeric substrate layer b) has a hardness of at least 5° Shore A greater than that of said photopolymerizable relief-forming layer a), and wherein the photopolymerizable relief-forming layer a) is present on the elastomeric substrate layer b).

2. The laminate of claim 1, wherein said laminate comprises the sequence of layers (1) to (6):
(1) a substrate film;
(2) optionally a release layer;
(3) the elastomeric substrate layer b);
(4) the photopolymerizable relief-forming layer a);
(5) optionally a release layer; and
(6) a cover sheet.

3. A hollow cylinder comprising the laminate of claim 1.

4. A process for producing a photopolymerizable, cylindrical, continuous, seamless, flexographic printing element from a laminate comprising a) a photopolymerizable relief-forming layer comprising an elastomeric binder, ethylenically unsaturated monomers, a photoinitiator, and optionally further additives;
b) an elastomeric substrate layer which is optionally photopolymerizable comprising an elastomeric binder, optionally ethylenically unsaturated monomers, a photoinitiator, and optionally further additives;
wherein said photopolymerizable relief-forming layer a) has a hardness of 30 to 70° Shore A and said elastomeric substrate layer b) has a hardness of from 75° Shore A to 70° Shore D in the photopolymerized state, and wherein said elastomeric substrate layer b) has a hardness of at least 50 Shore A greater than that of said photopolymerizable relief-forming layer a),
said process comprising:
(i) cutting the edges of the laminate to be joined to size by means of mitre cuts;
(ii) pushing on and locking a hollow cylinder on a rotatably mounted support cylinder;
(iii) applying an adhesion-promoting layer to the outer surface of the hollow cylinder;
(iv) mounting the laminate cut to size, with the elastomeric substrate layer b), on the hollow cylinder provided with the adhesion-promoting layer, the ends provided with the mitre cut resting substantially one on top of the other but not overlapping;
(v) optionally peeling off a cover sheet from said photopolymerizable relief-forming layer a);
(vi) joining the cut edges by bringing the surface of the photopolymerizable layer on the hollow cylinder into contact with a rotating calender roll with heating until the cut edges are joined to one another; and
(vii) removing the processed hollow cylinder from the support cylinder.

5. The process of claim 4, wherein the elastomeric substrate layer is photopolymerizable and preexposed to actinic light from the side facing away from the cover sheet, directly or through the substrate film, prior to (iii).

6. The process of claim 4, wherein said adhesion-promoting layer is a double-sided adhesive tape.

7. The laminate of claim 1, wherein the elastomeric substrate layer is photopolymerizable.

* * * * *